United States Patent [19]

Faulkner

[11] Patent Number: 4,788,494
[45] Date of Patent: Nov. 29, 1988

[54] POWER MEASURING APPARATUS

[75] Inventor: Eric Faulkner, Cookham Dean, England

[73] Assignee: Refac Electronics Corporation, Winsted, Conn.

[21] Appl. No.: 670,757

[22] Filed: Jan. 9, 1985

[51] Int. Cl.$^4$ .......................................... G01R 22/00
[52] U.S. Cl. .................................... 324/142; 364/841
[58] Field of Search ........................ 324/140 R, 142; 328/160; 364/841; 307/498

[56] References Cited

U.S. PATENT DOCUMENTS

| | | | |
|---|---|---|---|
| 3,304,419 | 2/1967 | Huntley, Jr. et al. | 364/841 |
| 3,448,297 | 6/1969 | Rhodes | 364/841 X |
| 3,532,868 | 10/1970 | Embly | 364/841 |
| 3,629,567 | 12/1971 | Bruggemann | 364/841 |
| 3,662,187 | 5/1972 | Ayres et al. | 307/498 X |
| 3,689,752 | 9/1972 | Gilbert | 364/481 |
| 3,714,462 | 1/1973 | Blackmer | 307/498 X |
| 3,764,908 | 10/1973 | Elms | 324/142 |
| 3,805,092 | 4/1974 | Henson | 307/498 |
| 3,961,257 | 6/1976 | Milkovic | 324/142 |
| 4,004,141 | 1/1977 | Curtis | 364/841 |
| 4,042,815 | 8/1977 | Brown et al. | 328/160 X |
| 4,156,283 | 5/1979 | Gilbert | 364/841 |
| 4,165,485 | 8/1979 | Takahashi | 324/142 |
| 4,316,107 | 2/1982 | Talbot | 328/160 X |

OTHER PUBLICATIONS

Jung, W., "I.C. Op Amp Cookbook", 3rd. Ed., 1986.
IEEE Journal of Solid-State Circuits, Gilbert, B., "A High Performance Monolithic Multiplier Using Active Feedback", Dec. 1974, pp. 364-373.
Richardson, J. et al., "Measurement of Pulse Energy", Electronic Equipment News, Jun. 1970, pp. 12-21.
Faulkner, E. et al., "New Type of Analog Multiplier with Wide Dynamic Range", Electronics Letters, Mar. 23, 1972, vol. 8, No. 6, pp. 145-146.

Primary Examiner—Jerry Smith
Assistant Examiner—Stephen M. Baker
Attorney, Agent, or Firm—McCormick, Paulding & Huber

[57] ABSTRACT

Apparatus for measuring the mean value of instantaneous power supplied to an electrical device computes the product of two voltage signals each proportional to the instantaneous voltage and current respectively. A self-biasing current source generates a DC signal current proportional to the magnitude of one voltage signal with a mean value equal to one-half the peak-to-peak magnitude of the voltage signal. A log-antilog multiplier circuit computes the product of the DC current signal and the other input voltage signal. A current mirror connected to the multiplier cancels DC offset currents to improve accuracy of the apparatus.

8 Claims, 3 Drawing Sheets

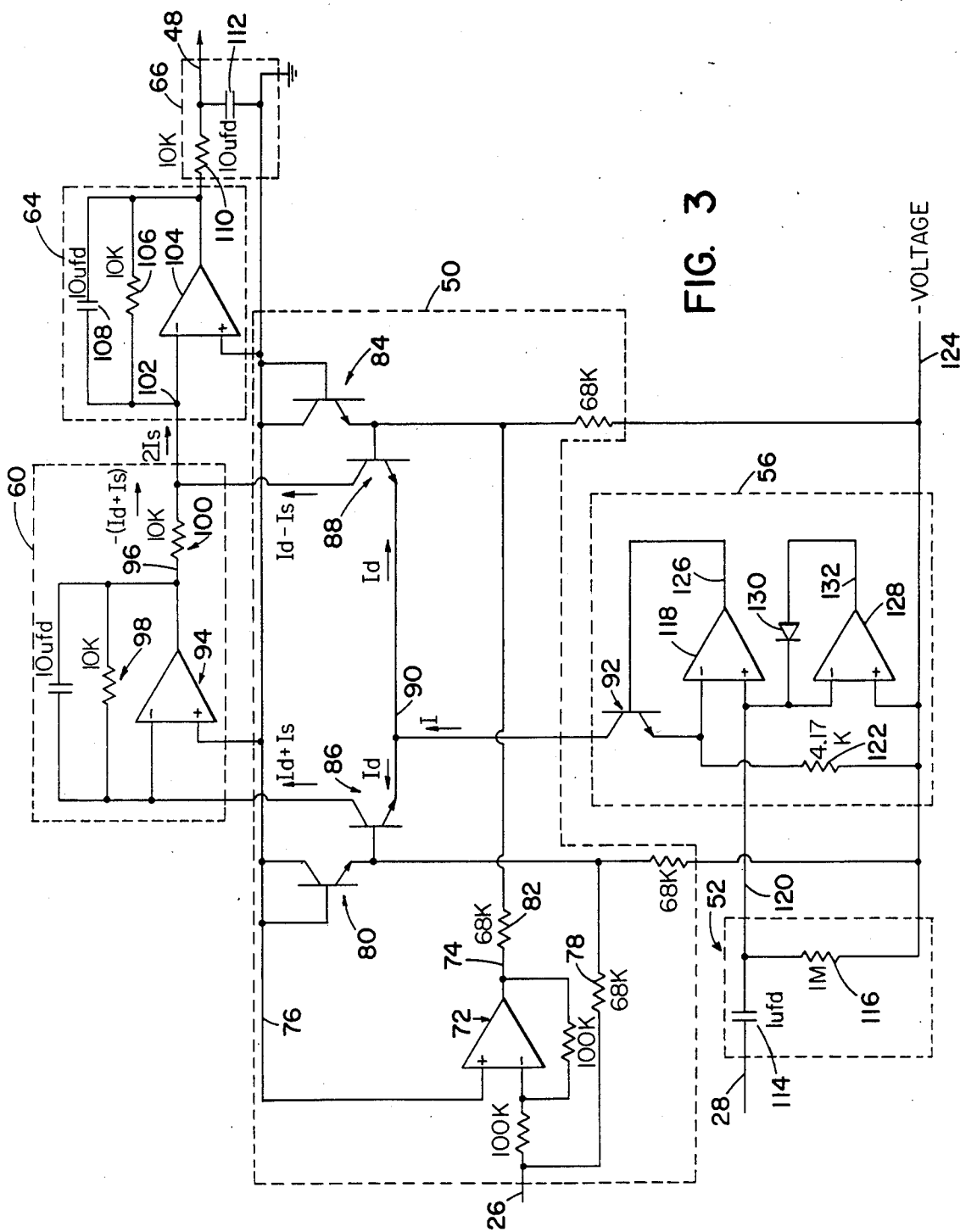

POWER MEASURING APPARATUS

BACKGROUND OF THE INVENTION

The present invention relates generally to power measuring apparatus and deals more particularly with an improved apparatus or circuit for producing an output signal proportional to the product of two input signals.

Generally the power supplied to an electrical device such as, for example, a home appliance, can be determined from the resultant product of the magnitudes of the voltage measured across the input terminals to the device and the current supplied to the device. Power measuring apparatus, such as power meters, power monitors and the like are often designed to operate with and compute power from voltage and current signals having sinusoidal waveshapes and magnitudes within a predetermined range. Power measuring apparatus of the aforementioned type generally have a limited dynamic measuring range and require sinusoidal waveshape signals for proper operation. However, voltage and current waveshapes are not always sinusoidal and may often exceed anticipated maximum values. It is useful and desirable in many instances to know the mean value of instantaneous power supplied to a device and therefore the measuring apparatus must be capable of operating with instantaneous voltages and currents varying over several orders of magnitude.

In order to more accurately measure power for voltage and current magnitudes outside a preselected range, a different power measuring range corresponding to the magnitudes of the particular range of voltage and current associated with the electrical device being measured must be selected, which selection conditions the measuring apparatus to operate in the selected measuring range. For example, a power range selected in a measuring apparatus having an accuracy of 1% full scale reading would read within ±20 watts of the actual power reading when the 2,000 watt range is selected; that is, a power of 2,000 watts might be indicated in the range of 1,980 to 2,020 watts and a power of 200 watts might be indicated in the range of 180 to 220 watts. It is readily seen that the 200 watt reading using the 2,000 watt selected range is subject to an approximate error of 10%. Therefore, it is necessary to select a lower maximum measuring range, say 200 watts, to measure with an accuracy of ±2 watts. It will be seen that a measured power of 2 watts might not even be read when measured with a 200 watt selected range. Consequently, either the user or the power measuring apparatus itself must select an appropriate measuring range to obtain a reasonably accurate power measurement at a full scale reading.

Changing the selected measuring range to accommodate fluctuating input voltage and current signals or varying operating conditions of the electrical device connected to the measuring apparatus is often inconvenient because the user may be making repairs, adjustments and the like to the device while observing changes in the measured power and the changes may cover one or more ranges. Auto-ranging power measuring apparatus is generally very costly and possesses accuracy characteristics similar to manually range selected type power measuring apparatus.

One problem often associated with the lack of accuracy over a wide measuring range in a low cost power measuring apparatus is the presence of a DC offset voltage in the power output signal. The output signal is generally produced by a multiplier circuit of some type which computes the product of the voltage and current supplied to the electrical device connected to the measuring apparatus.

The voltage-current product computation can be implemented using a standard commercially available four-quadrant analog multiplier integrated circuit however, power measuring apparatus implemented using such integrated circuits generally exhibit an output error due to the pesence of a DC offset voltage in the output signal and which error is generally in the range of 1% of full scale for the measuring range selected. In addition, integrated circuit multipliers are generally costly and require several external components to function properly. Other, more conventional, multiplier circuits implemented using low cost, discrete components also exhibit static output errors in the range of 1% of full scale due to DC offset voltage in the output signal caused in part by circuit components having unmatched characteristics and in part by the design of the multiplier. The DC offset voltage can be reduced somewhat by utilizing circuit compensating techniques such as null suppression and balancing. Generally such compensation also requires additional circuit components and adds to the cost and complexity of the multiplier circuit and the power measuring apparatus.

The purpose of the invention is therefore to provide a low cost easily implemented multiplier circuit for producing an output voltage signal proportional to the product of two unknown input voltage signals particularly useful in implementing a low cost power measuring apparatus.

Another aim of the present invention is to provide a digital readout power measuring apparatus constructed using low cost, standard solid-state components and having a wide dynamic measuring range in the order of 200 to 1.

It is yet a further aim of the present invention to provide a multiplier circuit for producing a DC output voltage proportional to the product of two input voltage signals which DC output voltage signal has substantially zero DC offset voltage to produce a static output error of substantially less than 0.05% of the full scale reading.

Other objects and advantages of the invention will be apparent from the following description and claims taken in conjunction with the accompanying drawings.

SUMMARY OF THE INVENTION

The invention resides in an apparatus for measuring the mean value of instantaneous power supplied to an electrical device by computing the product of a first and second voltage signal each being proportional to the instantaneous voltage and current respectively supplied to the electrical device. The product is a third voltage signal proportional to the instantaneous power supplied to the device.

The invention more specifically resides in a self-biasing current source circuit for generating a DC current signal proportional to the magnitude of the second voltage signal and a logarithmic-anti-logarithmic (log-antilog) multiplier circuit coupled to the current source and the first voltage signal to compute the product of the first and second signals.

The invention also specifically resides in a current mirror circuit which removes the DC offset current components associated with the ouput signal current computed by the log-antilog circuit and the self-biasing current source circuit.

BRIEF DESCRIPTION OF THE DRAWINGS

FIG. 3 is a schematic diagram of one embodiment of the circuitry of the present invention.

DETAILED DESCRIPTION

Figure 1:
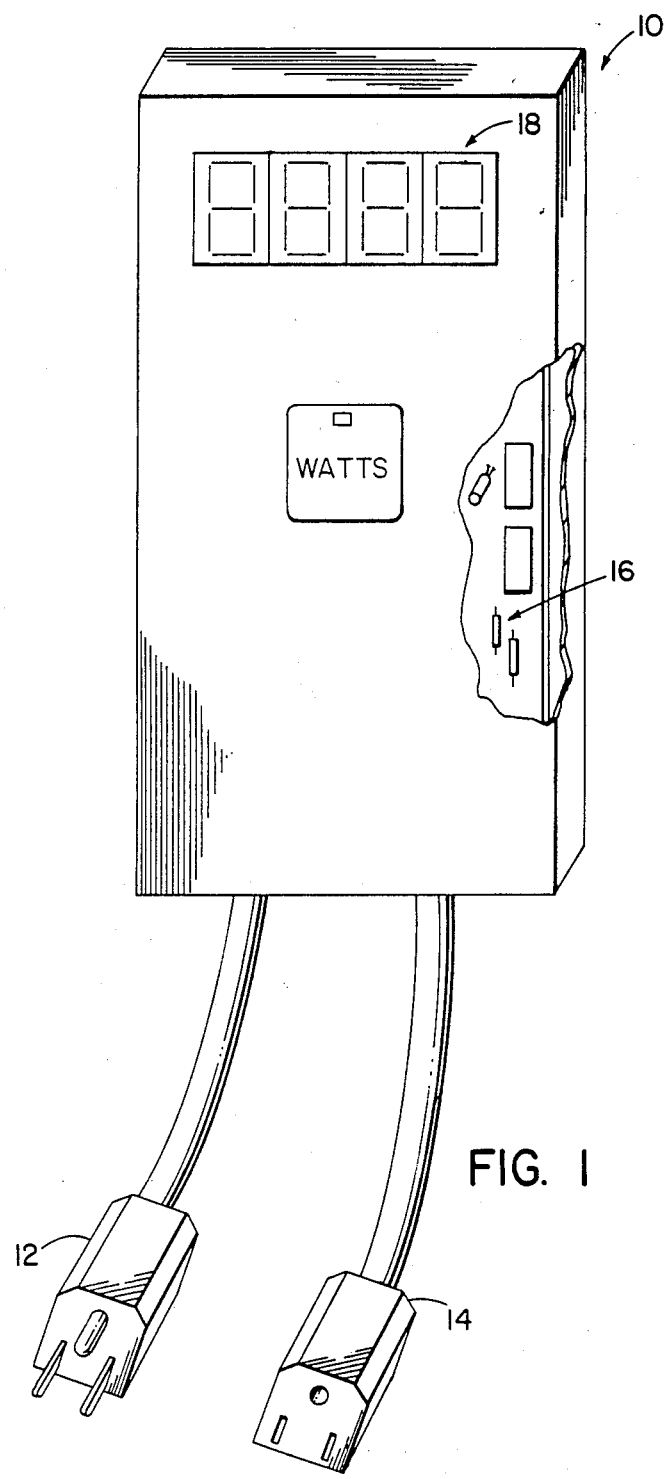
FIG. 1 shows a perspective view of a power meter having circuitry embodying this invention.

Referring now to the drawings and considering FIG. 1 in particular, a power meter having a digital display and embodying the present invention is shown therein and is designated generally by the numeral 10. The illustrated power meter 10 is arranged to be electrically connected between a conventional AC electrical outlet via a standard 110 volt AC plug 12 and an electrical device whose power is being measured. The device is electrically coupled to the power meter by a conventional AC receptacle 14. The magnitude of the voltage and current supplied to the electrical device being measured is sensed by an electrical circuit within the meter and designated generally at 16 to produce a first voltage signal proportional to the magnitude of the instantaneous voltage supplied to the electrical device and a second voltage signal proportional to the instantaneous current supplied. A multiplier circuit embodying the present invention and also within the circuit 16 computes the product of the sensed voltage and current signals to produce an output signal representative of the instantaneous power supplied to the electrical device. The output signal is conditioned by other circuit means within the circuit 16 to drive a four-digit seven segment display designated generally at 18 to show in numerical form the magnitude of the mean value of instantaneous power supplied to the electrical device connected to the meter.

Figure 2:
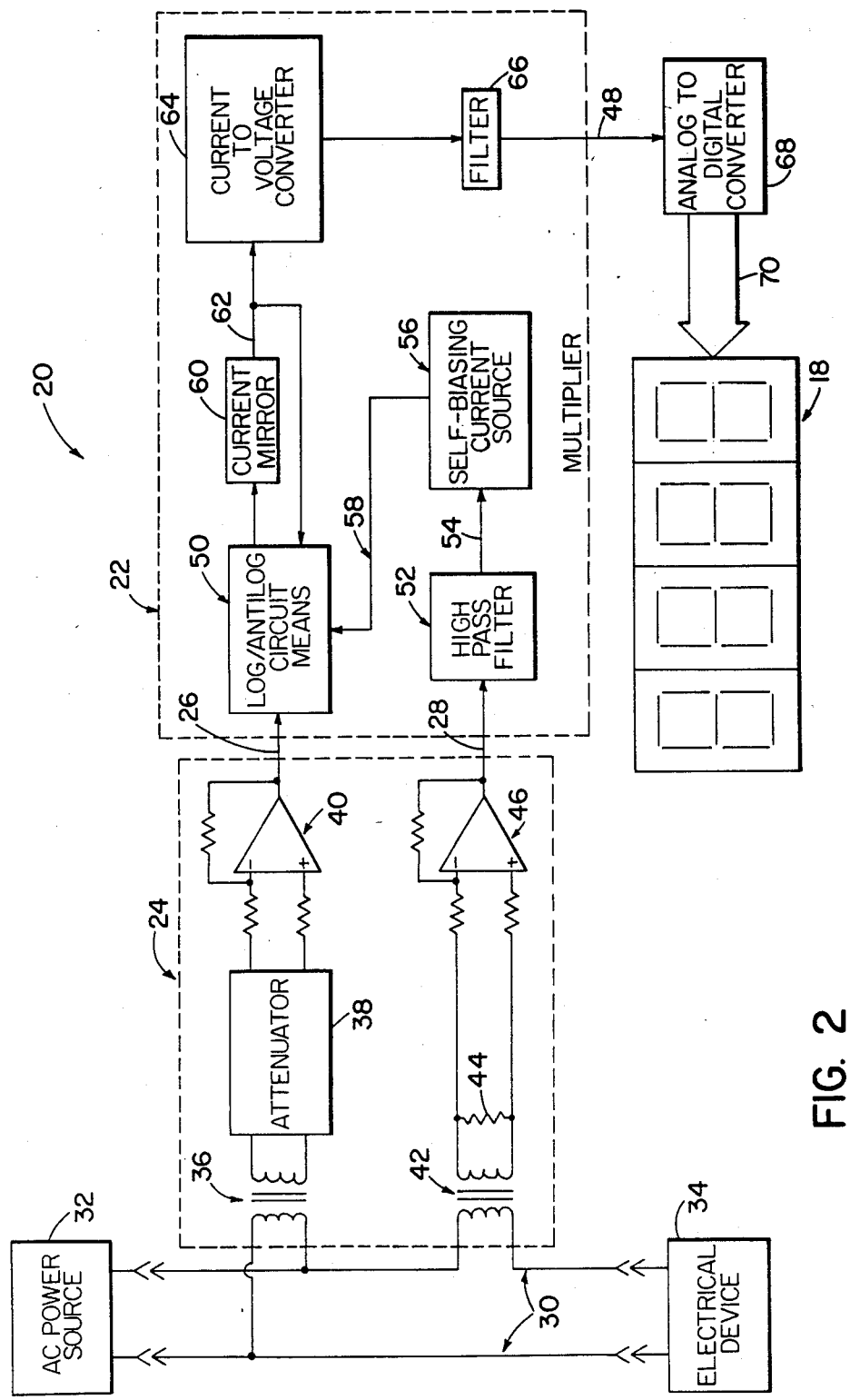
FIG. 2 is a functional diagram part in schematic form and part in block diagram form, of the power meter of FIG. 1.

Referring now to FIG. 2 a block diagram illustrating the major functional components of an embodiment of the power meter of FIG. 1 is shown therein and is generally designated by the numeral 20. A multiplier circuit embodying the present invention is included within the dashed lines and is generally designated by the numeral 22. A sensing and scaling circuit designated generally at 24 provides voltage signals proportional to the sensed voltage and current input signals to the multiplier 22 on leads 26 and 28 respectively. The power to be measured flows in a circuit comprised, for example, by a pair of voltage transmission line conductors 30. In one use of the power meter embodying the present invention, the pair of conductors 30 carry conventional and commercially available AC electrical power from an AC power source 32 to an electrical device 34. A suitable voltage transformer 36 designed to operate over the range of approximately 50 to 600 volts AC is connected across the conductors 30 to sense the voltage supplied to the electrical device 34 and to couple the sensed voltage to an attenuator 38. The attenuator 38 functions as a voltage divider to reduce the sensed high voltages to lower magnitude voltages for compatability with the solid-state semi-conductor devices used in the apparatus 20. A differential input instrumentation amplifier circuit generally designated at 40 is connected to the output of attenuator 38 and senses and amplifies a voltage, when present across its input terminals, to provide an amplified AC signal at its output connected to lead 26 proportional to the instantaneous voltage supplied to the electrical device 34.

A standard current transformer 42 having a primary and secondary winding has its primary winding coupled to one of the pair of conductors 30 and the transformer, in the illustrated example, is designed to provide a current transformation from 2,000 amperes to 5 amperes. A resistor 44 is connected across the secondary winding and senses the transformed current, when present, to develop a voltage drop across its terminals proportional to the current flowing through it. The resistor 44 is selected to provide a maximum voltage drop of 250 millivolts when a maximum 5 amperes transformed current is supplied to the current transformer secondary winding. A differential input instrumentation amplifier circuit designated generally at 46 is coupled to the current sensing resistor 44 and senses and amplifies a voltage, when present across its input terminals, to provide an amplified AC signal at its output connected to lead 28 proportional to the instantaneous current supplied to the electrical device 34.

A high pass filter generally designated at 52 conditions the voltage signal appearing on lead 28 and feeds the conditioned signal via lead 54 to the input of a dynamic, self-biasing current source generally designated at 56 which current source forms an important feature of the present invention and is explained in greater detail hereinbelow. For present purposes it is sufficient to say that the current supplied by the current source 56 at its output on lead 58 varies in a direct relationship with the magnitude of the input voltage signal on lead 28 to maintain linear operation over a wide range of input voltages and accommodates in the illustrated embodiment an input voltage signal corresponding to a current flowing in the transmission conductors 30 ranging from 0 to 2,000 amperes peak-to-peak.

The current signal on lead 58 and the voltage signal on lead 26 are multiplied together by a log-antilog circuit means generally designated at 50. The output of the log/antilog circuit is fed to the input of a current mirror generally designated at 60. The current mirror 60 produces a current signal at its output on lead 62 which is fed back to the log-antilog circuit 50 to insure that the circuit 50 operates linearly and to cancel DC currents produced by the multiplication process.

The output current signal from the current mirror 60 is also fed to a DC current-to-voltage converter generally designated at 64. The output of the voltage converter 64 is fed to a low pass filter 66 to smooth out any ripple in the output voltage signal due to the multiplication process to produce a DC output voltage signal on lead 48 proportional to the mean value of instananeous power.

The DC signal on lead 48 is fed to an analog-to-digital convertor generally designated at 68. The convertor 68 senses the DC level present at its input and converts the signal to a digitally formatted signal representative of the DC voltage signal level present at its input. The digitally formatted signal is applied to a segment driver bus 70 in the proper signal format to drive the four-digit display unit 18. The display unit 18 provides a numeric representation of the magnitude of the mean value of instananeous power supplied to the electrical device 34. The analog-to-digital convertor 68 may be implemented by a commercially available integrated circuit, such as, for example, a multi-digit direct display drive analog-todigital converter manufactured by Teledyne Semiconductor.

Referring now to FIG. 3 and to the detailed circuit schematic shown therein, a multiplier circuit embodying the present invention and corresponding to the multiplier circuit 22 of FIG. 2 operates as described hereinbelow. As previously described, a first voltage signal representative of the instantaneous voltage is supplied to one input at lead 26 and a second voltage signal representative of the instantaneous current is supplied to a second input at lead 28. The first and second voltage signals are multiplied by the circuit 22 to produce a third voltage signal product at the output lead 48 proportional to the mean value of instantaneous power.

The input voltage signal at lead 26 is coupled to the inverting input of an operational amplifier generally designated at 72 to produce an inverted voltage signal at its output 74 equal in magnitude and of opposite phase to the input voltage signal at lead 26. The non-inverting input to amplifier 72 is connected to electrical ground potential via conductor 76. The input signal appearing on lead 26 is also coupled through resistor 78 to a first input logarithmic computing device 80 and the inverted input signal on lead 74 is coupled through resistor 82 to a second input logarithmic computing device 84.

The first and second input logarithmic computing devices are formed by NPN transistors each having diode connected base and collector terminals to provide a PN junction. In accordance with the characteristics of a PN junction, the voltage developed thereacross is logarithmically related to the base e to the junction current. The collector-emitter circuit of transistor 80 is connected to the base of NPN transistor 86 which transistor 86 forms a first output anti-logarithmic computing device. The collector-emitter circuit of transistor 84 is connected to the base of NPN transistor 88 which transistor 88 forms a second anti-logarithmic computing device. The emitters of transistors 86 and 88 are connected together and to node 90.

Node 90 is also connected to the collector terminal of an NPN transistor 92 which terminal comprises the output of the current source 56. The operation of the current source 56 is described in greater detail hereinbelow however, for purposes of illustration it is assumed that the current flowing into node 90 from transistor 92 is equal to I. Because the transistors 80, 84, 86 and 88 form a substantially balanced circuit, the DC current I flowing into node 90 splits and half the current I, defined as $I_d$, flows into the emitter of transistor 86 and half flows into the emitter of transistor 88.

The current mirror 60 functions to substantially eliminate any DC offset caused by the current I flowing from the current source 56 and from inbalance due to characteristic differences in transistors 80, 84, 86 and 88. The current mirror 60 operates as described in the following discussion.

The current flowing in the collector of transistor 86 comprises the sum of the current components $(I_d+I_s)$ where $I_s$ is related to the signal current generated by the log-antilog computing devices 80, 86 respectively. The current flowing in the collector of transistor 88 comprises the difference of the current components, $(I_d-I_s)$ due to the action of the log-antilog devices 84, 88 respectively. The collector current in transistor 86, $(I_d+I_s)$, is fed to the inverting terminal of an operational amplifier generally designated at 94 which amplifier comprises the current mirror 60 and generates a current at its output on lead 96 equal to $-(I_d+I_s)$ times the value of feedback resistor 98 which resistor is connected from the output of amplifier 94 to its inverting input terminal. The output of amplifier 94 is coupled through resistor 100 to the summing junction 102 of an operational amplifier 104 and because the value of resistor 100 is made equal to resistor 98, the magnitude of the current flowing into the summing junction 102 from the current mirror is equal to $-(I_d+I_s)$. The collector of transistor 88 is also connected to the summing junction 102 and its collector current, $(I_d-I_s)$ is summed with the current from the current mirror 60 to cancel the offset DC current $I_d$. The current flowing into the summing junction 102 is therefore equal to $2 \times I_s$ plus any ripple current due to the multiplication process, such as, for example, modulation products.

The current flowing into summing junction 102 is filtered by the DC current-to-voltage convertor 64 which comprises operational amplifier 104, resistor 106 and capacitor 108 to provide a voltage signal at the output of amplifier 104 proportional to the signal current $I_s$. Additional filtering is provided by the low pass filter 66 which comprises resistor 110 in series with the output of amplifier 104 and capacitor 112 connected between resistor 110 and the ground conductor 76. The voltage signal at the low pass filter output on lead 48 is a DC voltage substantially free of AC components and proportional to the product of the two input voltage signals on lead 26 and 28 respectively.

The multiplier circuit 22 includes a dynamic self-biasing current source 56 to accommodate variations in the sensed instantaneous current which variations can be three or more orders of magnitude. In a conventional constant current source the quiescent current, that is, the static operating point at which the input signal is equal to zero, is determined by considering the anticipated maximum peak-to-peak value of an input signal to prevent nonlinear operation due to limiting or clipping. Consequently, the quiescent current value that is necessary to accommodate large peak-to-peak value input signals introduces a significant DC offset current when used with signals having smaller peak-to-peak values. The offset current introduced by the current source is a major factor contributing to the inaccuracy of a multiplier circuit. Consequently, to insure linearity and high accuracy it is desirable to make the quiescent current only as large as necessary to accommodate the signal present at the current source input. This self-biasing is accomplished in the present circuit in the following manner.

An input voltage signal representative of the instantaneous current is provided on lead 28 and is coupled through a high pass filter 52 which filter comprises capacitor 114 and resistor 116, to the non-inverting input of an operational amplifier generally designated at 118 via conductor 120. The inverting input to operational amplifier 118 is connected to the emitter of transistor 92 and to a resistor 122 which resistor is connected to a negative supply voltage provided on conductor 124. The operational amplifier 118 output on lead 126 is connected to the base of transistor 92. The voltage signal appearing at the non-inverting input to operational amplifier 118 causes the output 126 to drive transistor 92 to provide sufficient current to make the voltage at the inverting input to amplifier 118 equal to the voltage at the non-inverting input. Since the voltage at the inverting terminal is equal to the voltage at the non-inverting terminal due to the high impedance characteristic of the diffential input to amplifier 118, the current flowing in the collecter circuit of transistor 92 is equal to the value of the voltage at the inverting terminal divided by the value of resistor 122. If transistor 92 has a high Beta, for example, 300, all but one three-hundreths of the current flows in the collectoremitter circuit of transistor 92 and therefore the current I provided by the current source 56 is directly proportional to the magnitude of the input voltage signal.

The non-inverting input to amplifier 118 is also connected to the inverting terminal of an operational amplifier 128 and to the cathode of a diode 130. The output of operational amplifier 128 on lead 132 is connected to the anode of diode 130. The non-inverting input of amplifier 128 is connected to the negative supply voltage on conductor 124. A positive voltage at the inverting terminal of amplifier 128 causes a negative output voltage on lead 132 which negative voltage reverse biases diode 130 and consequently the amplifier-diode circuit combination is effectively out of the circuit for positive values of the input voltage signal. However, when the input signal becomes negative, diode 130 becomes forward biased and the amplifier 128 pumps current through the diode and resistor 116 to oppose a change in the polarity of the voltage drop developed across the resistor caused by the negative voltage signal to keep the voltage on conductor 120 at a positive value. The amplifier 128 and diode 130 effectively attempt to charge capacitor 114 during the negative portion of an input signal so that the mean voltage developed across resistor 116 is equal to one-half the peak-to-peak input signal voltage present on lead 28. The voltage developed across resistor 116 is reflected across resistor 122 because of the differential input characteristics of amplifier 118 so that the mean quiescent current I supplied by transistor 92 is equal to one-half the peak-to-peak value of the input voltage signal. Consequently, the value of the quiescent current supplied by transistor 92 is self-biasing and is made only as large as necessary to accommodate the input signal present at lead 28 to prevent the current source from operating in a nonlinear fashion.

Power measuring apparatus including a multiplier circuit for generating the product of a voltage and current signal representative of the mean value of instantaneous power provided to an electrical device has been described in a preferred embodiment. It will be understood that numerous modifications and substitutions maybe made without departing from the spirit of the invention. Therefore, the invention has been described by way of illustration rather than limitation.

I claim:

1. Apparatus for measuring the mean value of instantaneous power supplied to an electrical device connected to an AC power source, said apparatus characterized by:

first circuit means for generating a first voltage signal proportional to the instantaneous voltage potential applied to said electrical device;

said second circuit means for generating a second voltage signal proportional to the instantaneous current delivered to said electrical device;

third circuit means responsive to said first and said second voltage signals for producing a third voltage signal representative of the product of said first and said second voltage signals and proportional to the instantaneous power supplied to said electrical device, said third circuit means including current mirror circuit means for cancelling DC error signals associated with said product of said first and second voltage signals, said third circuit means including a dynamic, self-biasing current source circuit means for automatically generating a range of DC quiescent current signals each of which DC quiescent current signals is different and related to and associated with the instantaneous magnitude of said second voltage signal present, and a log-antilog multiplier circuit means, said multiplier circuit means being coupled to said current source means and to said first voltage signal for computing the product of said DC current signal and said first voltage signal, said current source means including:

a high pass filter comprising a resistor and a capacitor and having an input terminal coupled to said second voltage signal and an output terminal, said capacitor being connected in series between said input and output terminals, said resistor being connected between said output terminal and a reference potential, said capacitor being charged in one direciton to produce a voltage having a first polarity when said second voltage signal is positive;

a first and second differential input instrumentation amplifier;

a diode;

an NPN bipolar transistor having emitter, base and collector terminals;

said first amplifier having its non-inverting input connected to said high pass filter ouput terminal and to said second amplifier inverting input, said first amplifier having its output connected to said transistor base terminal, said first amplifier having its inverting input connected to said transistor emitter terminal and to a high-ohmic value resistance element connected between said first amplifier inverting input and a negative polarity supply voltage pontential, said first amplifier producing an output signal for biasing said transistor to conduct current through said emitter and collector terminals and said resistance element to maintain the voltage at said first amplifier inverting input equal to the magnitude of said second voltage signal appearing at said first amplifier non-inverting terminal when said second voltage signal is positive, and said diode having its anode connected to the output of said second amplifier and its cathode to the junction of the inverting input of said second amplifier and the non-inverting input of said first amplifier and the output terminal of said high pass filter so that said diode is forward biased and conducts current from the output of said second amplifier into said junction when said second voltage signal is negative to maintain the polarity of the voltage appearing at said high pass filter output terminal the same as said first polarity and the mean magnitude of the voltage appearing at said filter output equal to one-half the peak-to-peak magnitude of said second voltage signal, said transistor being biased to produce a collector current mean value equal to one-half its peak-to-peak collector current value so that said DC current signal is produced in the linear operating region of said transistor for all instantaneous values of said second voltage signal.

2. Apparatus for measuring as defined in claim 1 characterized by said log-antilog circuit means including:

means for producing the opposite phase of said first voltage signal;

first and second logarithmic computing devices each of said devices having an input and output, said first device being coupled to one phase associated with said first voltage signal and said second device being coupled to the opposite of said one phase of said first voltage signal;

first and second anti-logarithmic computing devices, each of said devices having its respective first input connected together and to said collector terminal of said transistor comprising said current source means, said first anti-logarithmic device having a second input connected to the output of said first logarithmic device, said second anti-logarithmic device having a second input connected to the output of said second logarithmic device, each of said first and second anti-logarithmic computing devices having an output and developing a computed output signal current related to the product of current flowing in the inputs of said first and second logarithmic computing devices, respectively and in said first and second anti-logarithmic devices first inputs respectively, said computed output signal current including a current signal component associated with said first voltage signal and a DC offset current component associated with said second voltage signal, and current mirror circuit means coupled to said first and said second anti-logarithmic devices for removing said DC offset current component associated with said output signal current computed by said first and second anti-logarithmic devices, said current mirror having an input coupled to the output of one of said first and second anti-logarithmic computing devices and an output coupled to the output of the other of said first and second anti-logarithmic devices so that the algebraic sum of the DC currents flowing into a node comprising said current mirror output coupled to the output of said other of said first and second anti-logarithmic devices and the output of said other anti-logarithmic device cancel one another and said output signal currents from said first and said second anti-logarithmic devices add to one another.

3. Apparatus for measuring as defined in claim 2 further characterized in that said first and second logarithmic computing devices are bipolar transistors each having its respective base and collector terminals connected as a diode and each having an emitter terminal, the emitter terminal of one of said first and second logarithmic devices being connected to the second input of an associated one of said first and said second anti-logarithmic computing devices and the emitter terminal of the other of said first and second logarithmic devices being connected to the second input of the other of said first and said second anti-logarithmic devices wherein said first and second anti-logarithmic computing devices are bipolar transistors each having collector, base and emitter terminals, said emitter being said first input, said base being said second input and said collector being said output carrying said output signal current.

4. Apparatus for measuring as defined in claim 2 further charcterized by:

current-to-voltage converter circuit means for producing a DC output voltage signal proportional to said output signal current;

low pass filter circuit means coupled to said current-to-voltage converter means for filtering said DC output voltage signal to remove AC voltage signal components associated with the product of said first and said second voltage signals;

analog-to-digital converter circuit means coupled to said low pass filter output to produce a digitally formatted signal in binary coded form, said digital signal being representative of the value of the DC voltage present at said low pass filter output, and display means coupled to the output of said analog-to-digital converter for indicating in numeric form the magnitude of the mean value of the instantaneous power measured.

5. Apparatus for computing the product of the instantaneous magnitude of two voltage signals characterized by:

means for producing a first and a second voltage signal;

self-biasing current source circuit means for automatically generating a range of DC quiescent current signals each of which is related to and associated with the instantaneous magnitude of said second voltage signal present, and log-antilog multiplier circuit means, said mulitplier circuit means being coupled to said current surce means and to said first voltage signal for computing the product of said DC current signal and said first voltage signal;

said current source circuit means including a high pass filter comprising a resistor and capacitor and having an input terminal coupled to said second voltage signal and an output terminal, said capacitor being connected in series between said input and output terminals, said resistor being connected between said output terminal and a reference potential, said capacitor being charged in one direction to produce a voltage having a first polarity when said second voltage signal is positive;

a first and second differential input instrumentation amplifier;

a diode;

an NPN bipolar transistor having emitter, base and collector terminals;

said first amplifier having its non-inverting input connected to said high pass filter output terminal and to said second amplifier inverting input, said first amplifier having its output connected to said transistor base terminal, said first amplifier having its inverting input connected to said transistor emitter terminal and to a high-ohmic value resistance element connected between said first amplifier inverting input and a negative polarity supply voltage potential, said first amplifier producing an output signal for biasing said transistor to conduct current through said emitter and collector terminals and said resistance element to maintain the voltage at said first amplifier inverting input equal to the magitude of said second voltage signal appearing at said first amplifier non-inverting terminal when said second voltage signal is positive, and said diode connected to the output of said second amplifier and its cathode to the junction of the inverting input of said second amplifier and the non-inverting input of said first amplifier and the output terminal of said high pass filter so that said diode is forward biased and conducts current from the output of said second amplifier into said junction when said second voltage signal is negative said output current tending to maintain the polarity of the voltage appearing at said high pass filter output terminal the same as said first polarity and the mean magnitude of the voltage appearing at said filter output equal to one-half the peak-to-peak magnitude of said second voltage signal, said transistor being biased to produce a collector current mean value equal to one-half its peak-to-peak collector current value so that said DC current signal is produced in the linear operating region of said transistor for all instantaneous values of said second voltage signal.

6. Apparatus for computing the product of two voltage signals as defined in claim 5 characterized by said log-antilog circuit means including:

means for producing the opposite phase of said first voltage signal;

first and second logarithmic computing devices, each of said devices having an input and output, said first device being coupled to one phase associated with said first voltage signal and said second device being coupled to the opposite of said one phase of said first voltage signal;

first and second anti-logarithmic computing devices, each of said devices having its respective first input connected together and to said collector terminal of said transistor comprising said current source means, said first anti-logarithmic device having a second input connected to the output of said first logarithmic device, said second anti-logarithmic device having a second input connected to the output of said second logarithmic device, each of said first and second anti-logarithmic computing devices having an output and developing a computed output signal current related to the product of current flowing in the inputs of said first and second logarithmic computing devices respectively and in said first and second anti-logarithmic devices first inputs, respectively, said computed output signal current including a current signal component associated with said first voltage signal and a D.C. offset current component associated with said second voltage signal;

current mirror circuit means coupled to said first and said second anti-logarithmic devices for removing said DC offset current components associated with said output signal current computed by said first and said second anti-logarithmic devices, said current mirror having an input coupled to the output of one of said first and second anti-logarithmic computing devices and an output coupled to the output of the other of said first and second anti-logarithmic devices so that the algebraic sum of the DC currents flowing into a node comprising said current mirror output coupled to the output of said other of said first and second anti-logarithmic devices and the output of said other anti-logarithmic device cancel one another and said output signal currents from said first and said second anti-logarithmic devices add to one another;

current-to-voltage converter circuit means for producing a DC voltage signal proportional to said output signal current wherein said DC output voltage signal is the product of said first and said second voltage signals.

7. Apparatus for computing the product of two voltage signals as defined in claim 6 further characterized in that said first and second logarithmic computing devices are bipolar transistors each having its respective base and collector terminals connected as a diode and each having an emitter terminal, the emitter terminal of one of said first and second logarithmic devices being connected to the second input of an associated one of said first and said second anti-logarithmic computing devices and the emitter terminal of the other of said first and said second logarithmic devices being connected to the second input of the other of said first and said second anti-logarithmic devices wherein said first and second anti-logarithmic computing devices are bipolar transistors each having collector, base and emitter terminals, said emitter being said first input, said base being said second input and said collector being said output carrying said output signal current.

8. Apparatus for measuring the mean value of instantaneous power supplied to an electrical device connected to an AC power source, said apparatus characterized by:

first circuit means for generating a first voltage signal proportional to the instantaneous voltage potential applied to said electrical device;

second circuit means for generating a second voltage signal proportional to the instantaneous current delivered to said electrical device;

third circuit means responsive to said first and said second voltage signals for producing a third voltage signal representative of the product of said first and said second voltage signals and proportional to the instantaneous power supplied to said electrical device, said third circuit means including current mirror ciruit means for cancelling D.C. error signals associated with said product of said first and second voltage signals;

a dynamic, self-biasing current source circuit means for automatically generating a range of DC quiescent current signals each of which is related to and associated with the instantaneous magnitude of said second voltage signal present;

a log-antilog multiplier circuit means, said multiplier circuit means being coupled to said current source means and to said first voltage signal for computing the product of said second voltage signal and said first voltage signals;

a high-pass filter comprising a resistor and capacitor and having an input terminal coupled to said second voltage signal and an output terminal, said capacitor being connected in series between said input and output terminals, said resistor being connected between said output terminal and a reference potential, said capacitor being charged in one direction to produce a voltage having a first polarity when said second voltage signal is positive;

a first and second differential input instrumentation amplifier;

a diode;

an NPN bipolar transistor having emitter, base and collector terminals;

said first amplifier having its non-inverting input connected to said high pass filter output terminal and to said second amplifier inverting input, said first amplifier having its output connected to said transistor base terminal, said first amplifier having its inverting input connected to said transistor emitter terminal and to a high-ohmic value resistance element connected between said first amplifier inverting input and a negative polarity supply voltage potential, said first amplifier producing an output signal for biasing said transistor to conduct current through said emitter and collector terminals and said resistance element to maintain the voltage at said first amplifier inverting input equal to the magnitude of said second voltage signal appearing at said first amplifier non-inverting terminal when said second voltage signal is positive, and said diode having its anode connected to the output of said second amplifier and its cathode to the junction of the inverting input of said second amplifier and the non-inverting input of said first amplifier and the output terminal of said high pass filter so that said diode is forward biased and conducts current from the output of said second amplifier into said junction when said second voltage signal is negative to maintain the polarity of the voltage appearing at said high pass filter output terminal the same as said first polarity and the mean magnitude of the voltage appearing at said filter output equal to one-half of the peak-to-peak magnitude of said second voltage signal, said transistor being biased to produce a collector current mean value equal to one-half its peak-to-peak collector current so that said DC current signal is produced in the linear operating region of said transistor for all instantaneous values of said second voltage signal.

* * * * *